United States Patent [19]
Reed

[11] Patent Number: 5,130,947
[45] Date of Patent: Jul. 14, 1992

[54] MEMORY SYSTEM FOR RELIABLY WRITING ADDRESSES WITH REDUCED POWER CONSUMPTION

[75] Inventor: Paul A. Reed, Austin, Tex.

[73] Assignee: Motorola, Inc., Schaumburg, Ill.

[21] Appl. No.: 600,787

[22] Filed: Oct. 22, 1990

[51] Int. Cl.$^5$ .............................................. G11C 11/40
[52] U.S. Cl. ....................... 365/227; 365/49; 365/226
[58] Field of Search .......................... 365/49, 226, 227

[56] References Cited

U.S. PATENT DOCUMENTS 4,646,271 2/1987 Uchiyama et al. ................. 365/49

Primary Examiner—Terrell W. Fears
Attorney, Agent, or Firm—Robert L. King

[57] ABSTRACT

A memory system for translating addresses has an active pull-up transistor per CAM entry for guaranteeing that a valid CAM entry is loaded in a CAM array prior to addressing a RAM entry in A RAM array. The CAM has a load device connected to each entry for dynamically activating each CAM entry during an address translation. The RAM array has a plurality of RAM entries wherein each RAM entry is connected to a predetermined CAM entry by a Match-Line. A predetermined one of a plurality of driver transistors is connected to each active Match-Line for selectively charging each Match-Line to a predetermined active state during an address write operation, thereby reducing power consumed by non-selected CAM entries. Only one Match-line remains active in response to a "Hit" condition. Feedback between each Match-Line to a validity bit cell in each entry of the CAM is used to set each validity bit only after a successful write of a CAM entry.

8 Claims, 4 Drawing Sheets

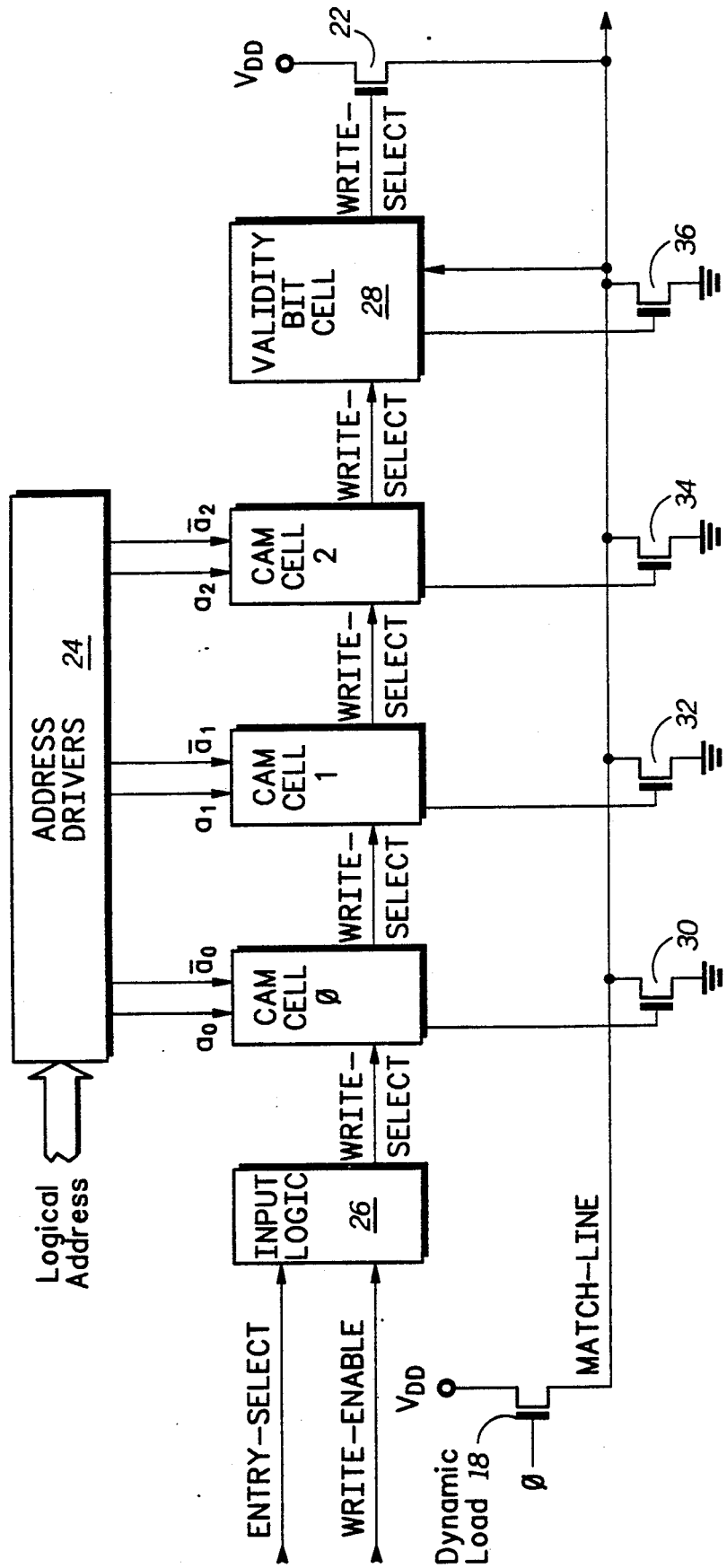

MEMORY SYSTEM FOR RELIABLY WRITING ADDRESSES WITH REDUCED POWER CONSUMPTION

FIELD OF THE INVENTION

This invention relates generally to memory circuits, and more particularly, to content addressable memory circuits.

BACKGROUND OF THE INVENTION

A data processing system that controls a large amount of memory will generally utilize a memory management system of some form. One commonly used memory management system provides memory circuits that translate the logical address output of a data processor to a physical address for the data processing system. The memory circuits utilized to perform this function include but are not limited to a Content Addressable Memory (CAM) circuit connected to a Random Access Memory (RAM) circuit along with a Control-Mechanism for controlling the loading of logical and physical addresses into the CAM and RAM arrays, respectively. The translation of a Logical Address, contained within the CAM, to a Physical Address, contained within the RAM, is speed critical since the speed of the data processing system is limited by the rate at which the data processor can access memory. FIG. 1 illustrates a prior art memory system 10 having a DC-Load 12, and a CAM array 14 connected to a RAM array 16 by Match-Lines. The CAM array 14 has of a plurality of CAM entries and RAM array 16 has a plurality of RAM entries with each CAM entry corresponding to a predetermined RAM entry.

Each CAM entry has a predetermined number of CAM cells, a Validity-bit cell, and an Input-Logic cell (not shown). A logical address input to CAM array 14 contains a predetermined number of individual logical address lines. The individual logical address lines are each connected to a predetermined CAM cell (not shown) of each CAM entry in CAM array 14. For example; a logical address line zero is connected to a CAM cell zero of each CAM entry in CAM array 14. Each CAM cell has a memory storage portion (not shown) and a compare logic portion (not shown). The memory storage portion has a storage cell that can be written. A Validity-bit cell (V) has a storage cell that can be written.

The compare logic portion contained within each CAM cell in CAM array 14 compares an individual logical address input of the CAM cell to the data stored within the storage portion of the CAM cell. If the individual logical address input matches the data stored within the storage portion of the CAM cell, the CAM cell compare logic allows the associated Match-Line to remain active. If the address input to the CAM cell does not matches the data stored within the storage portion of the CAM cell, the CAM cell compare logic deactivates the associated Match-Line.

The Match-Line for a CAM entry remains active in response to the connected DC-load under the following conditions. The first condition is that the Validity-bit cell of the CAM entry be active, meaning that the data stored within the storage portion of the CAM cell is valid and available for translation. The second condition for the Match-Line to remain active is that the logic state of the storage portion of the CAM cell match the logic state of the Logical Address input. When the above conditions are not met, the Match-Line is deactivated. When the Match-Line is deactivated, the DC-load connected to the Match-Line is consuming power.

Each RAM entry of RAM array 16 has a predetermined number of RAM cells. A physical address input to RAM array 16 contains a predetermined number of individual physical address lines. The individual physical address lines are each connected to one RAM cell for each RAM entry in RAM array 16. For example, physical address line zero is connected to RAM cell zero of each RAM entry of the RAM array 16.

For a translation operation, the Logical Address input to CAM array 14 is compared with each CAM entry in the CAM array and one of two conditions exists. There will either be a matching CAM entry (HIT) or no matching CAM entry (MISS). A HIT condition occurs when the Logical Address input matches a CAM entry with an active Valid-bit, and a MISS condition occurs when the Logical Address input does not match a CAM entry with an active Valid-bit.

When a HIT condition occurs, the Match-Line of the CAM entry that matched the Logical Address input remains active and thereby selects a predetermined RAM entry. The selected RAM entry then connects the contents of each RAM cell of the selected RAM entry to the Physical Address lines connected to RAM 16. The compare logic portion of each CAM cell of the CAM entries that did not match a Logical Address input will deactivate the associated Match-Line of the CAM entry thereby preventing the selection of a RAM entry from RAM array 16.

A write operation sequence begins with a Write-Select signal being activated. The Logical Address input to CAM array 14 is then stored in the storage portion of a selected CAM entry concurrently with the Validity-bit of the selected CAM entry being activated. The Match-Line of the selected CAM entry then becomes active in response to the connected DC-load, and the RAM entry connected to the active Match-Line is selected. The Physical Address at the input to RAM array 16 is then latched into the RAM cells of the selected RAM entry.

When a MISS condition occurs, a control mechanism associated with memory system 10 (not shown) will execute an algorithm using hardware and software that systematically searches external memory to locate a predetermined RAM entry. When the predetermined RAM entry is located in external memory, the control mechanism will write the CAM and RAM entries into the CAM array 14 and RAM array 16, respectively.

The power consumption associated with the DC-loads of each CAM entry is significant since all but one DC-load is consuming power during a translation and a write operation. Furthermore, since a common method of improving the translation speed of a CAM circuit is to increase the strength of the DC-load associated with each Match-Line of each CAM entry in CAM array 14, large CAM arrays that require large DC-loads to obtain the necessary speed become impractical because of the increased power requirements.

Memory system 10' of FIG. 2 is similar to memory system 10 of FIG. 1 and for the ease of illustration and discussion, functional blocks with the same number and the same signal names are used. There are two significant differences between the illustrated memory systems of FIG. 1 and FIG. 2. The first difference is the replacement of DC-load 12 with a Dynamic-load transistor 18 in FIG. 2. The Dynamic-load transistor 18 is illustrated as a transistor switch with a first current electrode connected to a power supply voltage $V_{DD}$, a second current electrode connected to the Match-Line, and a control electrode connected to a timing control signal labeled "$\phi$". The second difference between memory system 10 of FIG. 1 and memory system 10' of FIG. 2 is the addition of a plurality of OR gates, one per each CAM and RAM entry. One of the OR gates to an OR gate 20 illustrated in FIG. 2 and positioned between the CAM array 14 and the RAM array 16 OR gate 20 has a first input for receiving the Match-Line signal, a second input for receiving the Write-Select signal, and an output for providing a signal labeled "Word-Line" which is connected to a predetermined RAM entry.

For an address translation operation, the Write-Select signal from a control mechanism (not shown) is inactive and Dynamic-load transistor 18 activates the Match-Line during a predetermined time period when $\phi$ is active. Also when $\phi$ is active, the Logical Address input to the CAM array 14 is applied. When control signal $\phi$ is not active, the Logical Address input is compared with each CAM entry in CAM array 14. If there is a HIT, the Match-Line of the matching CAM entry will remain active thereby providing an active input to OR gate 20, which subsequently generates an active Word-Line signal. The active Word-Line signal thereby selects a predetermined RAM entry in RAM array 16 and the contents of each RAM cell of the selected RAM entry is connected to the Physical Address lines of RAM array 16. The compare logic portion of each CAM cell of the CAM entries that did not match the Logical Address input to CAM array 14 will then deactivate the associated Match-Line. Since the DC-load 12 of FIG. 1 was replaced by the Dynamic-load transistor 18 of FIG. 2, the power consumption problem associated with a DC-load to activate the Match-Line is eliminated.

For an address write operation, the Write-Select signal remains active during the write operation sequence. The active Write-Select signal enables the selected CAM entry to store the logical address input into the storage portion of the CAM cells of the selected CAM entry. The active Write-Select signal also activates the Word-Line signal which selects a predetermined RAM entry in RAM array 16. The Physical Address input to RAM array 16 is subsequently stored in the RAM cells of the selected RAM entry. At approximately the same time the Logical Address input to CAM array 14 is loaded into the storage portion of each CAM cell of the selected CAM entry, the Validity-bit of the selected CAM entry is activated. The power consumption during the write operation is essentially the same as for the address translation operation because the DC-load is replaced by the Dynamic-load. A significant difference between the memory system 10' of FIG. 2 and the memory system 10 of FIG. 1 is that the memory system 10' of FIG. 2 consumes less power when operating because of the use of a Dynamic-load transistor instead of a DC-load to activate the Match-Line for each of the CAM entries. Another difference between systems 10 and 10' is that the function of the Match-line is disabled in system 10' during an address write operation, thereby saving power.

Another similar memory system is taught by Uchiyma et al. in U.S. Pat. No. 4,646,271 entitled "Content Addressable Memory Having Dual Access Modes." Uchiyma et al. teach a memory system having a selector circuit coupled between a CAM array and a RAM array for concurrently addressing both the CAM and RAM arrays.

SUMMARY OF THE INVENTION

Accordingly, there is provided, in one form, a memory system for reliably writing address inputs to a content addressable memory (CAM) array and a random access memory (RAM) array for subsequent logical to physical address translation. The memory system has a CAM array having a plurality of entry locations. Each entry location stores a predetermined number of address bits and a validity bit indicating the validity of the address bits of a predetermined entry location. Each entry of the CAM array has a match output for indicating presence of matching validated address bits between an entry location and an input address. Each entry of the CAM array also has a write select input indicating selection of the entry location to be written to. A driver portion is coupled to the output of each entry of the CAM array. The driver portion has a control input coupled to the write select input for transitioning the match output from a first logic state to a second logic state in response to the write select input and logical address inputs. A feedback portion couples the match output of each entry location of the CAM array to the validity bit of each entry for setting the validity bit of a selected entry to a valid state after a successful write of the selected entry of the CAM array. A second memory is coupled to the CAM array having a plurality of entry locations. Each of the entry locations corresponds to a predetermined entry location of the CAM array. Each entry location of the second memory has an input coupled to a predetermined match output of the CAM array. The second memory provides a physical address in response to an input logical address.

These and other features, and advantages, will be more clearly understood from the following detailed description taken in conjunction with the accompanying drawings.

BRIEF DESCRIPTION OF THE DRAWINGS

FIG. 4 illustrates in partial block diagram form a CAM entry of FIG. 3 with control logic.

DESCRIPTION OF A PREFERRED EMBODIMENT

Figure 1:
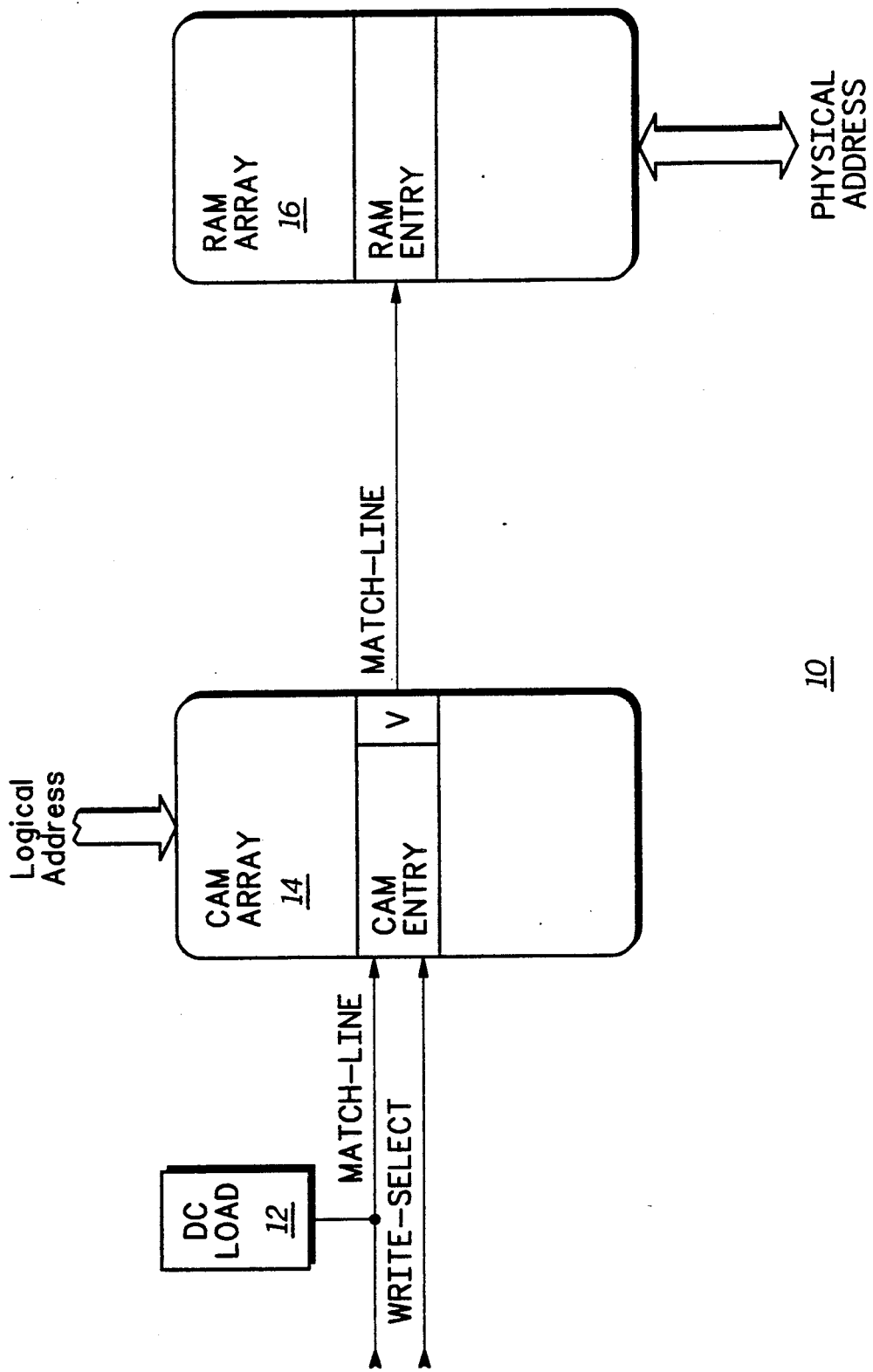
FIG. 1 illustrates in block diagram form a known memory translation system that utilizes a DC-load.
Figure 2:
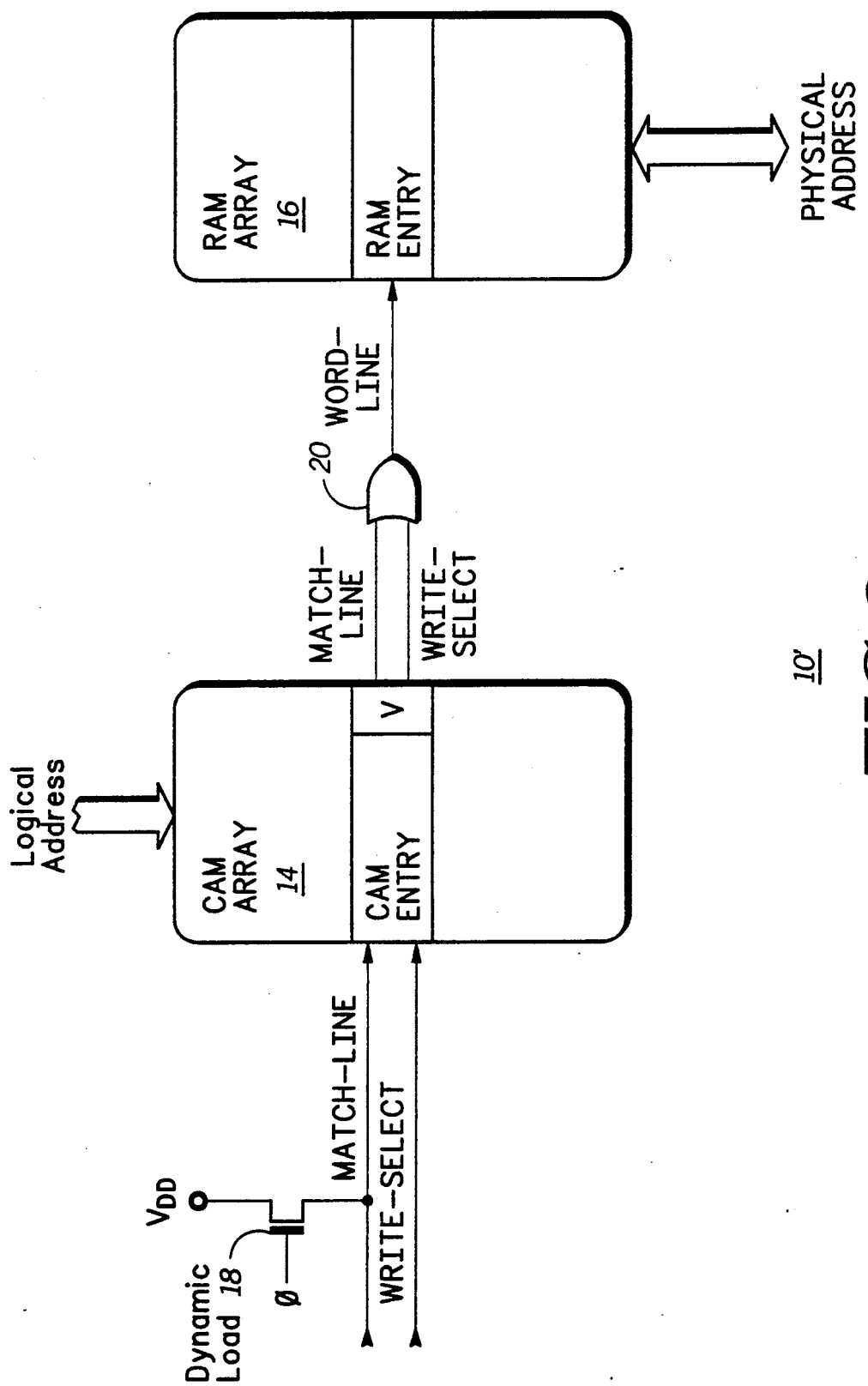
FIG. 2 illustrates in block diagram form a known memory translation system that utilizes a Dynamic-load.
Figure 3:
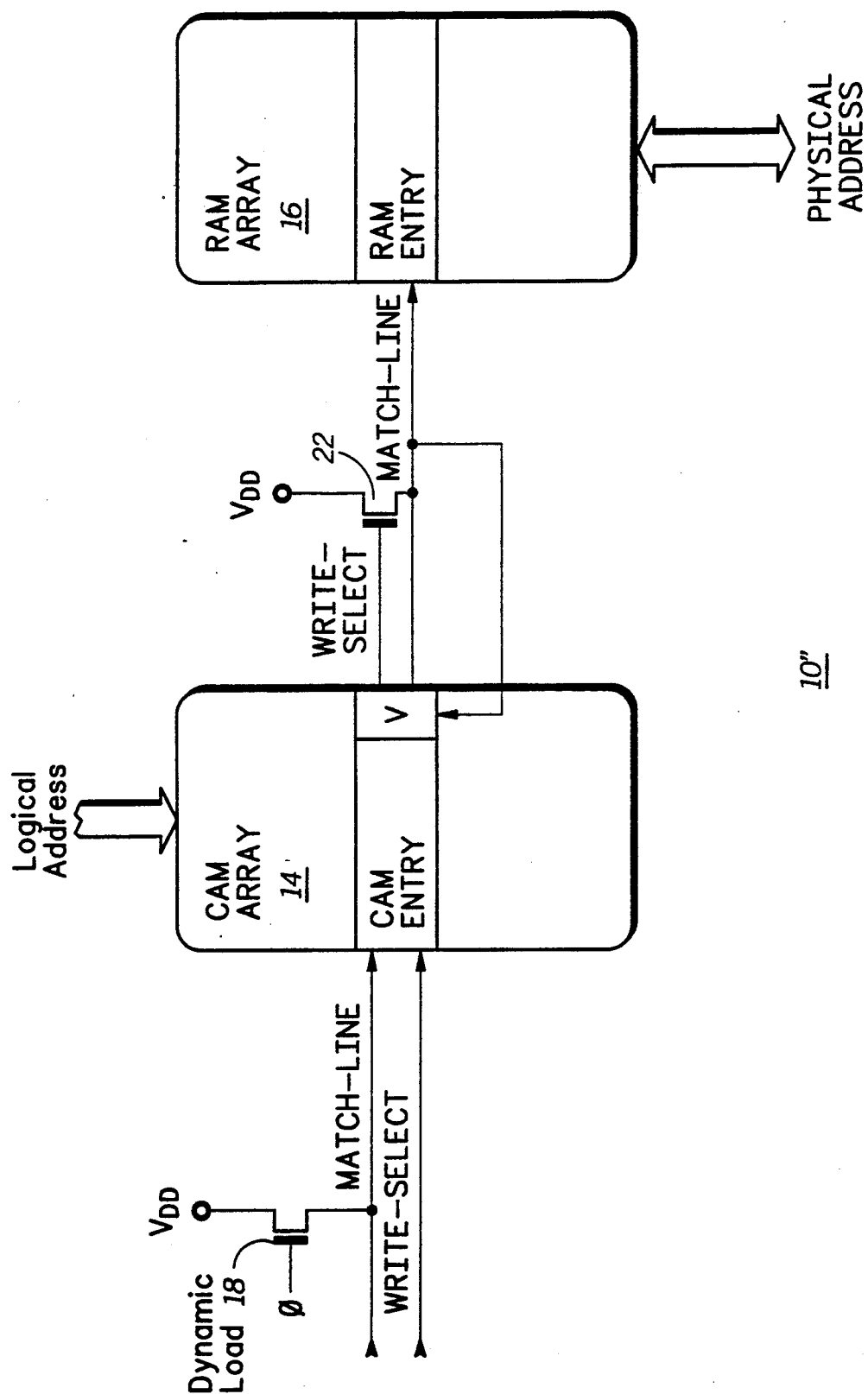
FIG. 3 illustrates in block diagram form a memory translation system in accordance with the present invention.

Shown in FIG. 3 is a memory system 10" in accordance with the present invention. For convenience of illustration and comparison with FIGS. 1 and 2, similar logic blocks and signal names are maintained between FIGS. 1-3. The memory system 10" of FIG. 3 has replaced the OR gate 20 of FIG. 2 with a transistor switch labeled Match-Line-driver transistor 22. Also, the Validity-bit of each CAM entry in FIG. 3, has an input from the respective Match-Line. Illustrated in FIG. 4 is an example of a three-bit CAM entry with the associated control logic. Since the illustration of FIG. 4 is essentially an internal view of a typical CAM entry in CAM array 14 of FIG. 3, the operational description that follows will primarily discuss FIG. 4 with minor references to FIG. 3.

Illustrated in FIG. 4 is a three-bit CAM entry from CAM array 14 with associated control logic. Associated with a CAM entry is a plurality of Address drivers 24, an input logic portion 26, a Validity-bit call 28, dynamic-load transistor 18, Match Line driver transistor 22, a CAM cell 0, a CAM cell 1, a CAM cell 2, a transistor switch 30, a transistor switch 32, a transistor switch 34, and a transistor switch 36. Each of transistor switches 30, 32, 34 and 36 has a control electrode, a first current electrode connected to the Match-Line, and a second current electrode connected to a ground terminal. It should be well understood that each of CAM cells 0, 1 and 2 may be implemented by any one of numerous well-known CAM cell circuit designs.

The Address drivers 24 of FIG. 3 have an input to receive a Logical Address input, and provide a true and a complement address output corresponding to each individual logical address input. Each true and complement logical address output is buffered and connected to a predetermined column of CAM cells in CAM array 14. For example, address lines a0 and $\overline{a0}$ are inputs to each CAM cell 0 of each entry of CAM array 14 in FIG. 3. The input logic portion 26 of FIG. 4 has a first input to receive a signal labeled "Entry-Select", a second input to receive a signal labeled "Write-Enable" and provides an output signal labeled "Write-Select." The Write-Select signal is connected to each CAM cell of the CAM entry, the Validity-bit cell 28, and Match Line driver transistor 22. The Validity-bit cell 28 has a first input to receive the Write-Select signal, a second input to receive the Match-Line signal, and provides an output connected to a control electrode of transistor switch 36. The Match-Line driver transistor 22 has a first current electrode connected to the Match-Line signal. The Match-Line driver transistor 22 activates the Match-Line signal when the Write-Select signal is active. The CAM cell 0 has a first input for receiving the Write-Select signal, a second and a third input for receiving the buffered address lines a0 and $\overline{a0}$, and provides an output that connects to the control electrode of transistor switch 30. The CAM cell 1 has a first input for receiving the Write-Select signal, a second and a third input for respectively receiving address lines a1 and $\overline{a1}$, and provides an output that connects to the control electrode of transistor switch 32. CAM cell 2 has a first input for receiving the Write-Select signal, a second and a third input for respectively receiving address lines a2 and $\overline{a2}$, and provides an output that connects to the control electrode of transistor switch 34. A control terminal of transistor switch 36 is connected to an output of the Validity-bit cell 28.

During an address translation operation of CAM array 14 as illustrated in FIG. 4, the Write-Enable signal to the input logic portion 26 is inactive which deactivates the Write-Select signal. The individual true and complement addresses, which are buffered outputs of the Address Drivers portion 24, route to the predetermined CAM cells and become valid during the same time period that Dynamic-load transistor 18 is activating the Match-Line. A compare logic portion (not shown) of each CAM cell compares the logic state of the storage portion of the CAM cell with the individual true and complement logical addresses to determine a HIT or a MISS condition. If the individual logical address input matches the data stored in the CAM cell, the output of the CAM cell that connects to the control gate of one of transistor switches 30, 32 or 34 is inactive. For example, if the logical address inputs a0 and $\overline{a0}$ match the data stored in the storage portion (not shown) of CAM cell 0, the output of CAM cell 0 that connects to the control electrode of transistor switch 30 is inactive. If the logical address input to each CAM cell of a CAM entry matches, and the associated Validity-bit is active, the Match-Line of the corresponding CAM entry will remain active. The active Match-Line of the CAM entry thereby activates a predetermined RAM entry in the RAM array 16 of FIG. 3 and the contents of each of a plurality of RAM cells (not shown) of the selected RAM entry is connected to the Physical Address input/output of the RAM array. If any one of the logical address inputs to a CAM cell does not match the data stored in the storage portion of the CAM cell, the output of the CAM cell that connects to the transistor switch connected to the Match-Line is activated and the Match-Line is deactivated (pulled low), thereby preventing the Match-Line of the CAM entry from selecting a RAM entry in RAM array 16.

During an address write operation, the Entry-Select and the Write-Enable signals to the Input Logic portion 26 of the CAM entry in FIG. 4 are activated which then activates the Write-Select signal. The active Write-Select signal enables Match-Line driver transistor 22 to activate the Match-Line of the selected CAM entry. Also, the active Write-Select signal into Validity-bit cell 28 deactivates the control electrode of transistor switch 36. Additionally, the active Write-Select signal enables the storage portion of the CAM cells of the selected CAM entry to store the logical address input from the Address drivers 24. There is however a time period that the storage portion of the selected CAM cells do not match the logical address input that is to be stored into the CAM cells. Match-line driver transistor 22 and the transistor switches 30, 32, 34 and 36 connected to the Match-line are size-ratioed transistors. If any one or more of the transistor switches 30, 32 and 34 which are controlled by the compare logic portion of the CAM cells are activated during the same time period that the Match-Line driver transistor 22 is active, the Match Line will become inactive. Not until the new logical address input is stored in the storage portion of the CAM cells to eliminate the "no match" condition, will the compare logic portion of each CAM cell allow the Match-Line driver transistor 22 to fully activate the Match-Line of the selected CAM entry. Once the Match-Line is activated, the Validity-bit is activated. Within a same memory access cycle, a predetermined RAM entry is selected in RAM array 16 and the Physical Address input to RAM array 16 is stored into the RAM cells (not shown) of the selected RAM entry. The present invention has replaced the OR gate 20 in FIG. 2 with driver transistor 22 of FIGs. 3 and 4. Driver transistor 22 not only reduces the logic required to implement the described functions but also guarantees that a valid Logical Address is stored into the selected CAM entry during an address write operation before the associated Validity-bit is activated and before the Physical Address input to RAM array 16 is stored into a predetermined RAM entry.

By now it should be apparent that there has been provided a memory system which efficiently translates logical address inputs to physical addresses. The efficiency is obtained by consuming D.C. power only in a CAM entry which is to be written to. Reliability of operation of the inventive memory system is also not dependent upon signal timing or subject to timing errors. It should be clear that the disclosed efficient memory address write operation is accomplished within a single memory access cycle.

While there have been described herein the principles of the invention, it is to be clearly understood to those skilled in the art that this description is made only by way of example and not as a limitation to the scope of the invention. For example, the number of CAM cells per CAM entry or the number of CAM and RAM entries which may be implemented may be readily varied when practising the present invention. Various known types of CAM and RAM cell circuits may be used to respectively implement CAM array 14 and RAM array 16. Further, although specific MOS transistors have been illustrated, any type of transistors may be used to implement the present invention. Accordingly, it is intended, by the appended claims, to cover all modifications of the invention which fall within the true spirit and scope of the invention.

I claim:

1. A memory system for reliably writing address inputs thereto for subsequent logical to physical address translation, comprising:

a content addressable memory (CAM) having a plurality of entry locations, each entry location storing a predetermined number of address bits and a validity bit indicating the validity of the address bits of a predetermined entry location, each entry location of the CAM having a match output for indicating presence of matching validated address bits between an entry location and a received input logical address, each entry of the CAM also having a write select input indicating selection of an entry location to be written to;

driver means coupled to the output of each entry of the CAM, the driver means having a control input coupled to the write select input for transitioning the match output from a first logic state to a second logic state in response to the write select input and logical address inputs;

feedback means coupling the match output of each entry location of the CAM to the validity bit of each entry for setting the validity bit of a selected entry to a valid state only after a successful write of the selected entry of the CAM; and a second memory coupled to the CAM having a plurality of entry locations, each of which corresponds to a predetermined entry location of the CAM, each entry location of the second memory having an input coupled to a predetermined match output of the CAM, the second memory providing a physical address in response to the received input logical address.

2. The memory system of claim 1 wherein the driver means further comprise a single transistor per entry of the CAM, each transistor having a first current electrode coupled to a power supply voltage terminal, a control electrode coupled to the write select input, and a second current electrode coupled to the match output.

3. The memory system of claim 2 wherein the second memory is a random access memory (RAM), each entry location of the RAM being coupled to a second current electrode of a predetermined single transistor of the driver means and to a predetermined match output of the CAM.

4. In a memory system for translating logical addresses to physical addresses having a content addressable memory (CAM) array and a random access memory (RAM) array, a method of writing address inputs to both the CAM array and the RAM array, comprising the steps of:

implementing the CAM array with a plurality of entry locations, the CAM array having an input for receiving an input logical address;

storing a predetermined number of address bits and a validity bit in each entry location of the CAM array, the validity bit indicating the validity of the address bits of a predetermined entry location, each entry location of the CAM array having a match output for indicating presence of matching validated address bits between an entry location and the received input logical address, each entry of the CAM array also having a write select input indicating selection of an entry location to be written to;

coupling one of a plurality of driver transistors to the output of each entry of the CAM array, each driver transistor having a control electrode coupled to the write select input for transitioning the match output from a first logic state to a second logic state in response to the write select input and the received input logical address;

in each entry location of the CAM array, coupling the match output thereof to the validity bit thereof for setting the validity bit of a selected entry to a valid state only after a successful write of the selected entry of the CAM array;

coupling the RAM array to the CAM array, the RAM array having a plurality of entry locations, each of which corresponds to a predetermined entry location of the CAM array, each entry location of the RAM array having an input coupled to a predetermined match output of the CAM array; and providing a physical address at an output of the RAM array in response to the input logical address.

5. The method of claim 4 wherein the step of coupling one driver transistor to the output of each entry of the CAM array further comprises coupling a first current electrode of each driver transistor to a power supply voltage terminal, coupling a control electrode of each driver transistor to a predetermined write select output of each entry location, the write select output of each entry location indicating successful completion of a write operation to the entry location, and coupling a second current electrode to a predetermined match output.

6. An address translation memory system than guarantees loading of a first address in an entry of a first storage device prior to loading a second address in a corresponding entry of a second storage device, comprising:

a plurality of address drivers having an input for receiving a logical address and providing a plurality of corresponding true and complement address bits;

a content addressable memory (CAM) coupled to the plurality of address drivers and having a plurality of entry locations, each entry location having a plurality of cell circuits which each receive predetermined true and complement address bits for selective storage or comparison with previously stored address bits, each entry location having a validity bit for indicating a valid state of the entry location after a successful write to the respective entry location and having a match output for indicating presence of matching validated data between an entry location and an input address;

driver means coupled to the match output of each entry location of the CAM, said driver means transitioning the match output of a predetermined match output of a predetermined entry location of the CAM from a first logic state to a second logic state in response to the validity bit;

feedback means coupling the match output of each entry location of the CAM to the validity bit of each entry for setting the validity bit of a selected entry to a valid state only after a successful write of the selected entry of the CAM; and a random access memory (RAM) coupled to the CAM and having a plurality of entry locations, each of which corresponds to a predetermined entry location of the CAM, each entry location of the RAM having an input coupled to a predetermined match output of the CAM, the RAM providing a physical address in response to the received input logical address.

7. The address translation memory system of claim 6 wherein the driver means further comprise a plurality of transistors, the transistors comprising a transistor being connected between a power supply voltage terminal and each match output of the CAM.

8. The address translation memory system of claim 7 wherein each transistor of the plurality of transistors is an MOS transistor.

* * * * *